United States Patent [19]
Nojima et al.

[11] Patent Number: 5,146,178
[45] Date of Patent: Sep. 8, 1992

[54] IMPEDANCE-MATCHED, CLASS F HIGH-FREQUENCY AMPLIFIER

[75] Inventors: Toshio Nojima, Yokosuka; Sadayuki Nishiki, Yokohama, both of Japan

[73] Assignee: Nippon Telegraph and Telephone Company, Tokyo, Japan

[21] Appl. No.: 759,565

[22] Filed: Sep. 13, 1991

[30] Foreign Application Priority Data

Nov. 16, 1990 [JP] Japan ................................ 2-312503

[51] Int. Cl.$^5$ ............................................ H03F 3/193
[52] U.S. Cl. ............................... 330/251; 330/277; 330/306
[58] Field of Search ................... 330/192, 207 A, 251, 330/277, 286, 306

[56] References Cited

U.S. PATENT DOCUMENTS

4,717,884  1/1988  Mitzlaff .......................... 330/251

*Primary Examiner*—James B. Mullins
*Attorney, Agent, or Firm*—Cushman, Darby & Cushman

[57] ABSTRACT

An impedance matched class-F high frequency amplifier includes an input matching circuit receiving high frequency signals connected to the gate of the FET. The drain of the FET is connected to an output matching circuit which matches the fundamental frequency and the second harmonic frequency, and the output of the output matching circuit is connected to an even harmonic terminating circuit. The stray reactance componance at the output impedance of the FET is offset by the output matching circuit, and therefore the even harmonics terminating circuit can more accurately terminate the second harmonic frequencies.

20 Claims, 7 Drawing Sheets

IMPEDANCE-MATCHED, CLASS F HIGH-FREQUENCY AMPLIFIER

BACKGROUND OF THE INVENTION

1. Field of the Invention

This invention relates to a high-frequency amplifier. High-frequency amplifiers are used as power amplifiers for communication systems which transmit and receive high-frequency signals. This invention relates, more particularly, to a high-frequency amplifier with a high power efficiency. The power efficiency is represented by the ratio of a high-frequency output power against the supplied D.C. power.

2. Background Information

Figure 12:
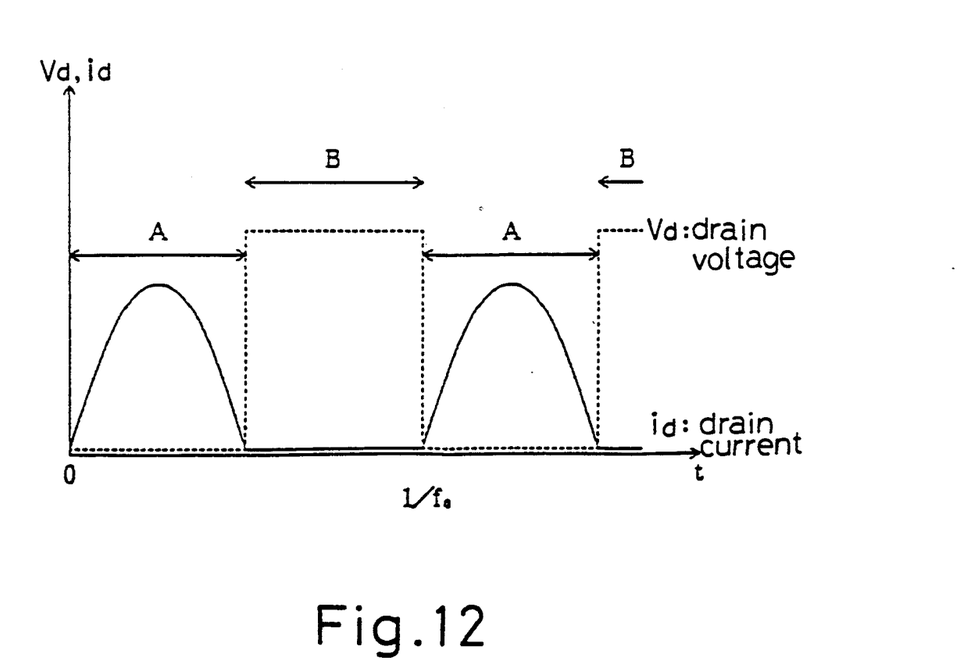
FIG. 12 is a graph to show the operation principle of a class-F amplifier.

A class-F amplifier is formed by adding a harmonic processing circuit to a class-B amplifier to increase power efficiency in a high-frequency amplifier. FIG. 12 shows an operating principle of the class-F amplifier. A FET is used as an active device in the following description, but the same effect is obtained when a bipolar transistor or an electron tube is used. In FIG. 12, the horizontal axis represents time t, the vertical axis drain volta $V_d$ and drain current $i_d$. The time waveform of the drain voltage $V_d$ is expressed with a broken line while that of the drain current is expressed with a solid line.

When a sine-wave with the fundamental frequency $f_0$ is inputted at a gate terminal of a FET which operates in class-B, the conduction between the drain and the source changes in a cycle of the frequency $f_0$. There is no conduction between the drain and the source in the region B in FIG. 12, so the drain voltage $V_d$ has a value other than zero. When there is conduction therebetween, on the other hand, as in the region A of FIG. 12, the drain volta $V_d$ becomes substantially zero. If a load which is matched for the fundamental frequency $f_0$, e.g. is open for an odd harmonic frequencies and is short-circuited for an even harmonic frequencies, is connected to the drain terminal, the time waveform of the drain voltage $V_d$ becomes a square wave which is represented by the fundamental waveform and the odd harmonic frequency component. The time waveform of the drain current $i_d$ then becomes a periodic half-wave which is represented by the fundamental wave and the even harmonic component. Therefore, when the drain current $i_d$ is passing, the drain volta $V_d$ becomes zero. Conversely, when the drain voltage is not zero, the drain current $i_d$ is not being passed. This makes the power consumption between the drain and the source zero, to thereby increase the power efficiency.

The power efficiency $\eta$ of a power amplifier can be expressed by the ratio of the high frequency output power $P_{RFout}$ against the input DC power $P_{DC}$ inputted between the drain and the source. If expressed in percentage, the relation holds as below.

$$= (P_{RFout}/P_{DC}) \times 100$$

$$= ((P_{DC} - P_{diss})/P_{dC}) \times 100$$

Where $P_{diss}$ is the power consumed by the power amplifier. If $P_{diss}$ is made zero, the power efficiency $\eta$ becomes 100%.

Figure 11:
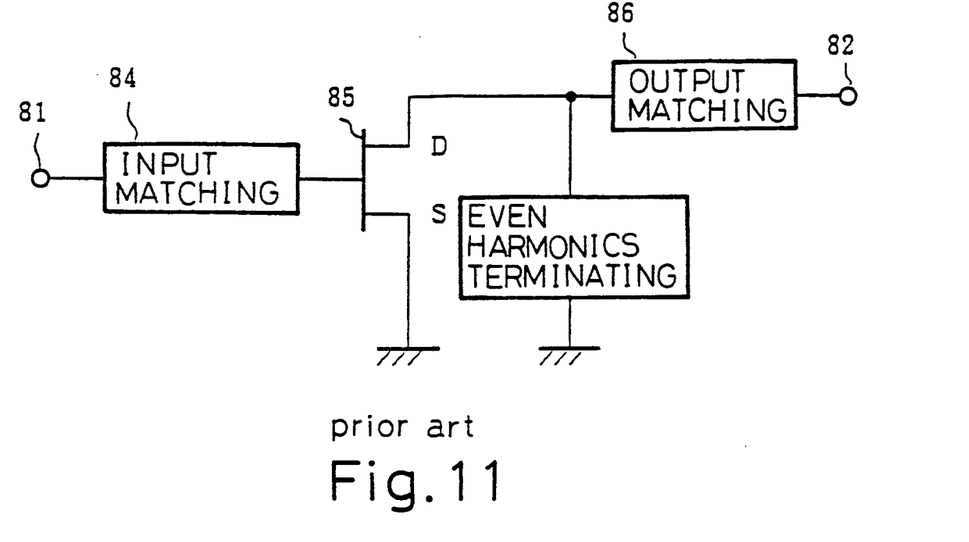
FIG. 11 is a block diagram to show an ideal example of the construction of prior art class-F amplifier.

FIG. 11 is a block diagram to show an example of an ideal construction of a prior art class-F amplifier wherein a signal input at an input terminal 81 from a input transmission line is supplied to a gate terminal of a FET 85 via an input matching circuit 84. The source terminal S of the FET 85 is grounded, and the output signal is transmitted from a drain terminal D to an output terminal 82 via an output matching circuit 86 and then to be outputted to the output transmission line. An even harmonic terminating circuit 88 is connected to the drain terminal D of the FET 85 in the class-F amplifier.

The input matching circuit 84 is a circuit for impedance transformation, and realizes impedance matching between the output impedance of the input transmission line and the input impedance of the FET 85 for an input signal of the fundamental frequency $f_0$. The output matching circuit 86 is also a circuit for impedance transformation, but it realizes the impedance matching between the output impedance of the FET 85 and the impedance of the output transmission line at the fundamental frequency $f_0$. The output matching circuit 86 is designed to have a high impedance for the harmonic frequency. The even harmonic terminating circuit 88 has impedance characteristics which make the circuit an open circuit for the fundamental frequency and the odd harmonic frequency but short-circuited for the even harmonic frequency. The input matching circuits are typically passive L-C circuits. Therefore, the impedance frequency characteristics of the load at the output (drain) of the FET 85 are such that the impedance becomes matched at the fundamental frequency, short-circuited at the even harmonic frequencies and open at the odd harmonic frequencies.

However, it is very difficult to realize a circuit which is perfectly open for the fundamental frequency and the odd harmonic frequencies but is perfectly short-circuited for all the even harmonic frequencies. The circuit is therefore usually constructed so as to be substantially short-circuited only for the second harmonic frequency, which has the largest power of all the even harmonic frequencies, and the even harmonic frequencies of the fourth or higher degrees are generally ignored. Since the odd harmonic frequencies are terminated to a high impedance, the even harmonic frequencies of the fourth or higher degrees are also frequently loaded with a high impedance. These circuits could provide a practically sufficient efficiency.

Figure 13:
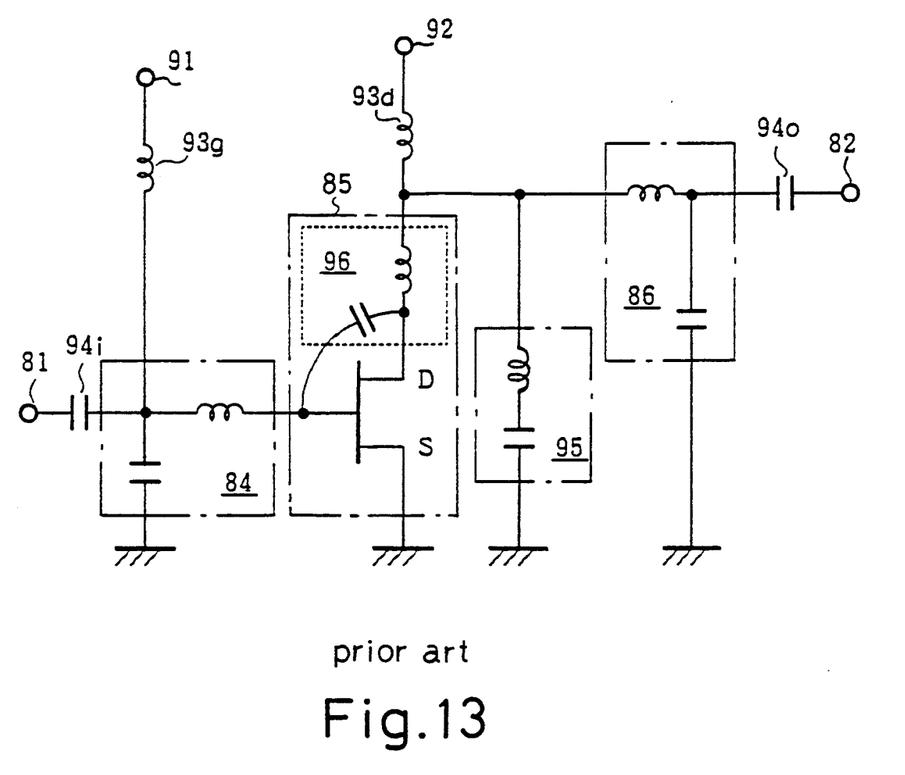
FIG. 13 is a circuit diagram to show a specific circuit construction of a prior art class-F amplifier using a FET.

FIG. 13 shows a specific example of circuit structure of a prior art class-F amplifier using a FET. The same component parts are denoted with the same reference numerals as in FIG. 11.

The FET 85 is shown modeled as a FET device which is an ideal active device, and a reactance which is caused by wire-bonding, package characteristics, etc. and impedance of the chip itself. FIG. 13 shows an equivalent circuit of the impedance as a reactance circuit 96 with inductance L and capacitance C. In the statement below, three terminals of a practical device, FET 85, are referred to as a gate terminal, a drain terminal and a source terminal while those for an ideal FET are referred to simply as a gate, a drain and a source.

The gate terminal of FET 85 is supplied with a gate bias from a gate voltage supply terminal 91 via a choke coil 93g and an input matching circuit 84. The drain terminal of the FET 85 is supplied with a drain bias from a drain voltage $V_d$ supply terminal 92 via a choke coil 93d. Condensers 94i and 94o are inserted respectively between the input terminal 81 and the input matching circuit 84 and between the output matching circuit 86 and the output terminal 82 in order to block direct current.

A second harmonic terminating circuit 95 comprises a series resonance circuit with inductance L and capacitance C so as to make the input impedance high at the fundamental frequency $f_0$ and short-circuited at the second harmonic frequency.

The output matching circuit 86 is a low-pass filter with inductance L and capacitance C and is designed to match the output transmission line with the input impedance of the FET 85 at the fundamental frequency and to have a high input impedance at the second harmonic frequency.

However, when a class-F amplifier for a high frequency band is realized with a FET device, the impedance which is shown by the reactance circuit 96 exists not only at the fundamental frequency but also at the second harmonic frequency. When viewed from an ideal FET drain, the load impedance is a combination of the two impedances of the second harmonic terminating circuit 95 and of the reactance circuit 96 at the second harmonic frequency. Therefore, even if the second harmonic terminating circuit resonates at the second harmonic frequency, the load when viewed from the drain is not usually short-circuited at the resonating impedance, and it is very difficult to realize the expected power efficiency.

This problem arises when the constant reactance of the reactance circuit 96 is too large to be ignored compared to the constant value of the second harmonic terminating circuit 95. In other words, the problem becomes more conspicuous as the frequency raises or when the physical chip size of the FET 85 is so large that various types of stray capacitance and inductance become large such as in a high power output transistor. Therefore, when a prior art class-F amplifier is configured as shown in FIG. 13, the theoretically high efficiency of the class-F amplifier cannot fully be realized in the high frequency band.

This invention aims to provide a high-frequency amplifier with a high power efficiency at harmonic frequencies which is not affected by various type of stray reactance caused by the structure of the active devices or by the packaging configuration.

SUMMARY OF THE INVENTION

In order to achieve the aforementioned object, this invention provides a high-frequency amplifier comprising an active device which amplifies a fundamental frequency of input high frequency signals in power and an output circuit which is inserted between an output of the active device and an output transmission on lines, the output circuit including an output matching circuit for matching the output from the active device with the output transmission line in impedance and an even harmonic terminating circuit which is designed to have high input impedance for the fundamental frequency and low input impedance for at least the second harmonic frequency thereof.

The output matching circuit is configured to impedance match not only for the fundamental frequency but also for the second harmonic frequency thereof. The high frequency amplifier according to this invention has an even harmonic terminating circuit which is connected to the output side of the output matching circuit. The term impedance matching used herein means that two impedance circuits which are connected with each other in complex conjugates.

The even harmonic terminating circuit is preferably configured to have high input impedance for odd harmonic frequencies of the fundamental frequency. It is preferable that a reactance circuit be provided between the even harmonic terminating circuit and the output transmission line to have a high input impedance for the second harmonic frequency.

The output matching circuit may be configured to have a high input impedance for the third harmonic frequency or may achieve impedance matching for the third harmonic frequency. In order to achieve impedance matching, the even harmonic terminating circuit should be structured to have high input impedance for the third harmonic frequency and a reactance circuit should be provided between the even harmonic terminating circuit and the output transmission line to achieve high input impedance for the third harmonic frequency thereof.

According to this invention, a terminating circuit for the second harmonic being short-circuited is provided in the succeeding stage of the output matching circuit which is configured to impedance match not only for the fundamental frequency but also for the second harmonic frequency thereof. This prevents the reactance presence at the output terminal of the active device from influencing the short-circuit conditions of the second harmonic. Therefore, the short-circuit conditions for the second harmonic frequency can be realized highly precisely as the output load on the active device, to thereby improve the power efficiency.

If a reactance circuit is provided in the preceding stage of the output transmission line, the input impedance becomes high for the second harmonic frequency, and therefore, the short-circuit load conditions for the second harmonic can be determined at a still higher precision to attain a higher power efficiency.

When the input impedance of the output matching circuit is set high for the third harmonic frequency, as the output matching circuit itself can realize open load conditions for the third harmonic, a power efficiency can be obtained at a level still higher than the case when the second harmonic frequency alone is used.

When the third harmonic frequency is matched by the output matching circuit, because open impedance conditions can be determined in the succeeding stage of the even harmonic terminating circuit, the influence from the reactance on the output of the active device can be similarly avoided. More particularly, in addition to the short-circuit load conditions for the second harmonic, the open load conditions for the third harmonic can be realized at a higher precision, to thereby further improve the power efficiency.

The construction and values of the circuit elements to achieve such characteristics would become more difficult to design if harmonics of higher order are taken into consideration. However, so far as the fundamental frequency, second and third harmonic frequencies are concerned, the values can easily be determined by means of a computer aided design support system.

DETAILED DESCRIPTION OF THE INVENTION

Figure 1:
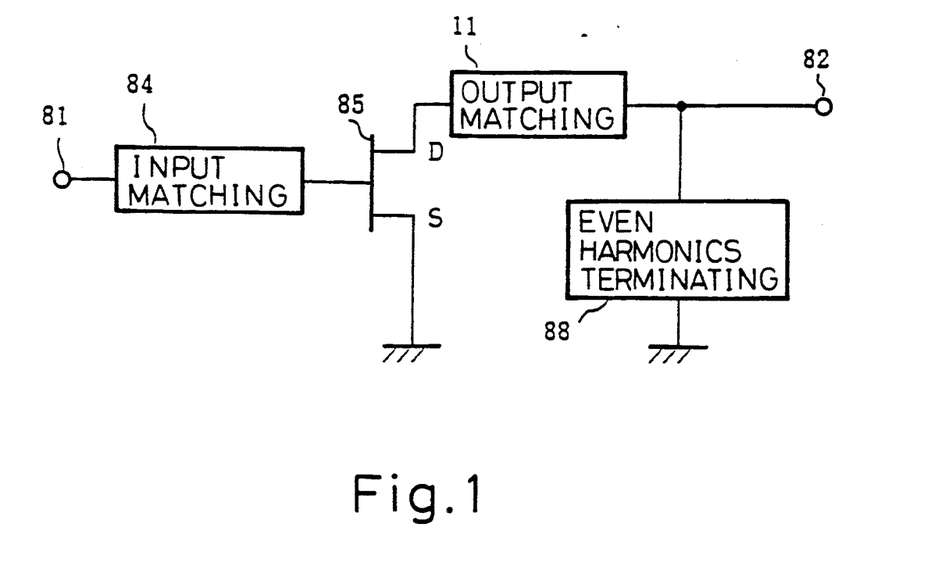
FIG. 1 is a block diagram to show the basic construction of this invention.

FIG. 1 is a block diagram to show the basic construction of this invention.

The invention includes an input terminal 81, an output terminal 82, an input matching circuit 84, a FET 85 and an even harmonics terminating circuit 88 which are similar to the corresponding circuits of the prior art class-F amplifier shown in FIG. 11.

However, the amplifier of this embodiment also includes an output matching circuit 11 which is constructed to match the impedance of the output from the FET 85 with that of the output transmission line connected to the output terminal 82 not only for the fundamental frequency but also for the second harmonic frequency thereof, and an even harmonic terminating circuit 88 is connected to the output side of the output matching circuit 11.

Embodiments will now be described specifically wherein a circuit 95 which terminates the second harmonic is used as the even harmonic terminating circuit 88. The input matching circuit 84, the output matching circuit 11, and even harmonic terminating circuit 88 may be constructed with lumped constant elements such as inductances and capacitances or distributed constant elements using microstrip lines. Structures with lumped constant elements will be described in the following explanation for illustration.

Figure 2:
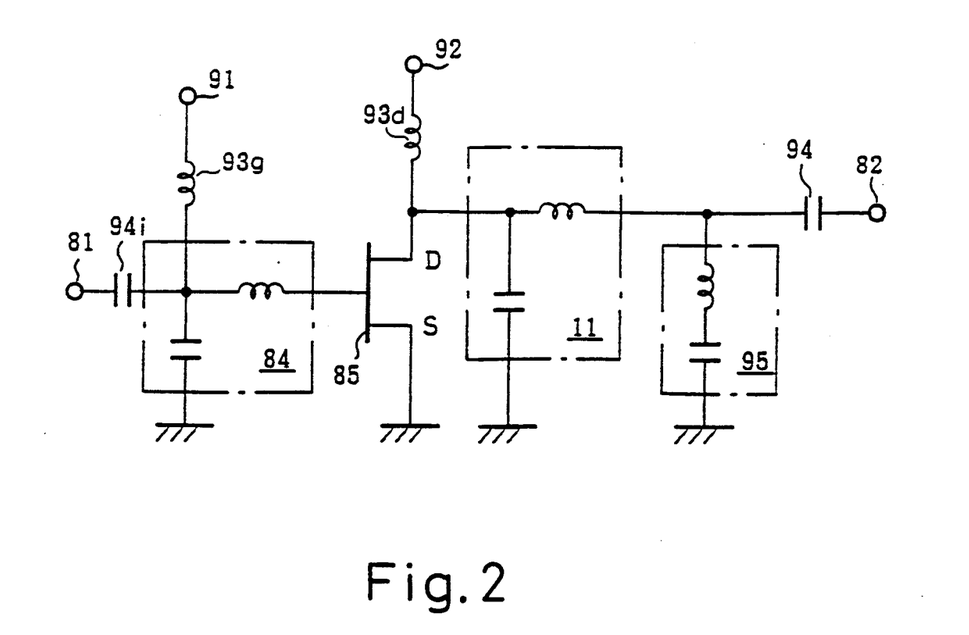
FIG. 2 is a circuit diagram to show the first embodiment of this invention.

FIG. 2 is a circuit diagram to show the first embodiment of this invention wherein the output matching circuit 11 has an inductance L and capacitance C. The element constants of L and C are selected to match in conjugate the output impedance of the FET 85 with the impedance of the output transmission line for the fundamental frequency and the second harmonic frequency. In this embodiment, the inductance L is serially connected to the output transmission line while the capacitance C is connected in parallel to the load, but the characteristics necessary for the circuit 11 are those related to conjugate matching alone, and positions of the connections of L and of C may be reversed in selecting the element constants. As the reactance component at the output impedance of the FET 85 is offset by the output matching circuit 11 of the above structure, the real reactance to be connected to the drain terminal of the FET 85 becomes the second harmonic terminating circuit 95 along. On the other hand, as the second harmonic terminating circuit 95 is configured to short-circuit and resonate at the second harmonic frequency, short-circuit load conditions can be determined precisely for the second harmonic at the drain terminal of the FET 85 without being influenced by various types of stray reactance in the FET 85.

Because the matching conditions can be satisfied at the same time for the fundamental frequency, the load conditions can be determined very precisely for the second harmonic which is most important to the voltage/current waveforms necessary to operate an ideal class-F amplifier shown in FIG. 12 to thereby achieve a high efficiency.

Figure 3:
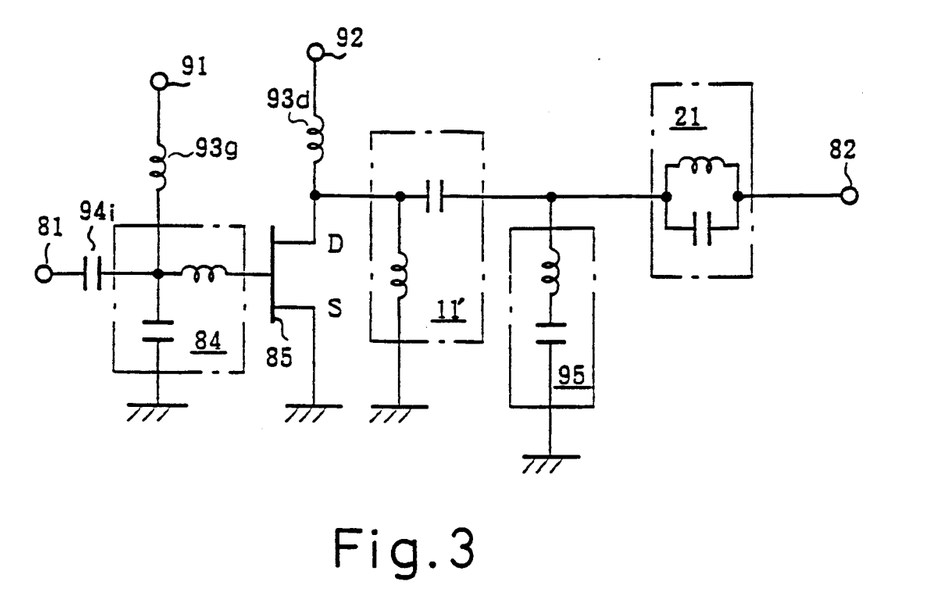
FIG. 3 is a circuit diagram to show the second embodiment of this invention.

FIG. 3 is a circuit diagram to show the second embodiment of this invention. This embodiment has a parallel resonant circuit 21 with inductance L and capacitance C inserted between the second harmonic terminating circuit 95 and the output terminal 82. The circuit 21 is set to have an element constant to resonate at the second harmonic frequency. This makes the impedance viewed from the side of the second harmonic terminating circuit 95 extremely high at a level which could be regarded as almost open at the second harmonic frequency. The second harmonic terminating circuit 95 serially resonates at the second harmonic frequency to make its impedance extremely low.

In this embodiment, an output matching circuit 11' having an inductance and capacitance L and C at positions reversed to those of the circuit 11 shown in FIG. 2 is used. In this case, since C is in series in the output transmission line, the condenser $f_0$ in FIG. 2 is not necessary for preventing direct current.

In the first embodiment shown in FIG. 2, the load of the FET 85 at the second harmonic frequency is given as a parallel impedance of the resonant impedance of the second harmonic terminating circuit 95 and the impedance of the output transmission line. However, in the second embodiment shown in FIG. 3, the impedance on the side of the output transmission line becomes extremely high compared to the second harmonic frequency when viewed from the circuit 95. This reduces influence on the resonance characteristics of the second harmonic terminating circuit 95 caused by the connection with the output transmission line. Accordingly, the load conditions of the FET 85 for the second harmonic can be determined more closely to the ideal conditions for the operating conditions of the class-F amplifier to further improve the power efficiency.

Figure 4:
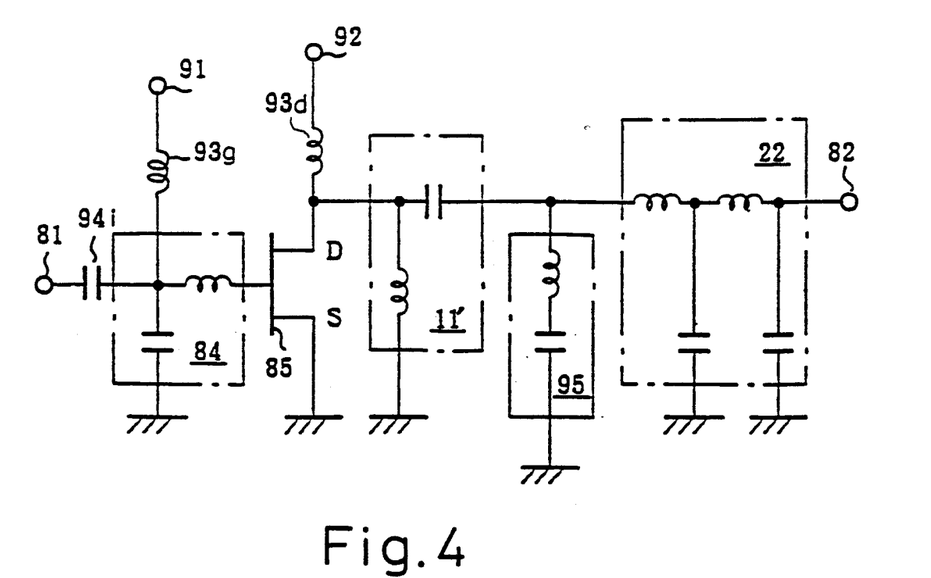
FIG. 4 is a circuit diagram to show the third embodiment of this invention.

FIG. 4 is a circuit diagram to show the third embodiment of this invention which is different from the second embodiment in that a low pass filter 22 having inductances L and capacitances C in two-stage construction is used as the reactance circuit inserted between the second harmonic terminating circuit 95 and the output terminal 82. The element constants of L and C which constitute the low pass filter 22 are set to have characteristics which pass the fundamental frequency with low loss and yet break at the second harmonic frequency with high impedance. The high impedance conditions which are realized in the structure shown in FIG. 3 by means of the parallel resonance circuit 21 are achieved by the low pass filter 22 for the second harmonic frequency.

Although the description refers to a two-stage construction, this invention may be alternately embodied by means of a low pass filter of one- or three-stage construction.

Figure 5:
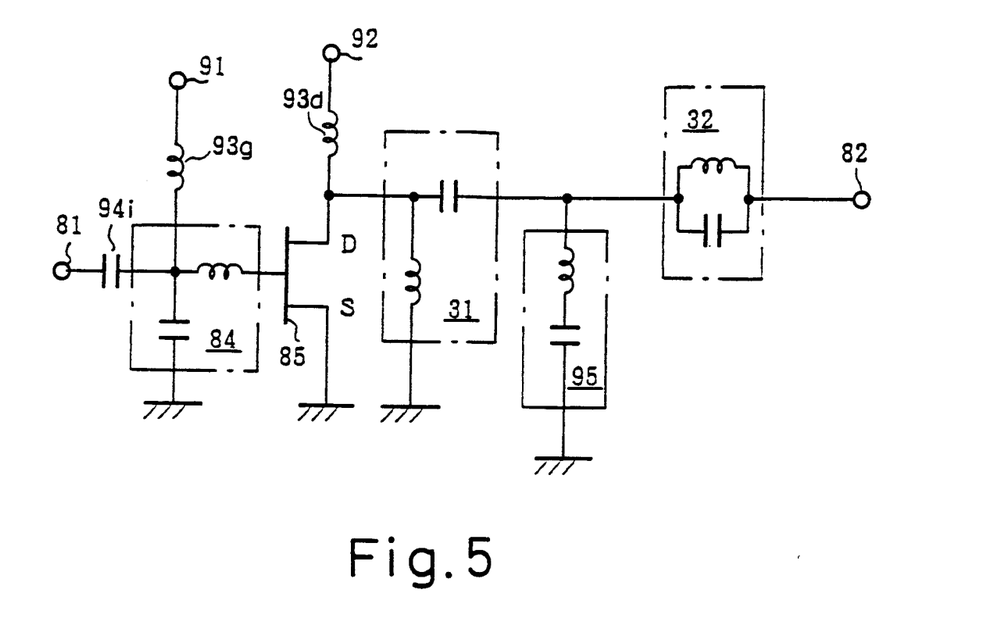
FIG. 5 is a circuit diagram to show the fourth embodiment of this invention.

FIG. 5 is a circuit diagram to show the fourth embodiment of this invention wherein the output matching circuits 11, 11' used in the above two embodiments are replaced with an output matching circuit 31. The circuit 31 comprises inductance L and capacitance C of which element constants are selected so that the output of the FET 85 is matched in conjugate with the output transmission line not only for the fundamental frequency and the second harmonic frequency but also for a third harmonic frequency. Although in FIG. 5 the output matching circuit 31 is shown to have a construction equivalent to the circuit 11' of the aforementioned embodiment, the construction is not necessarily the same depending on the characteristics of the active device. As the circuit 31 allows the third harmonic frequency to pass, it is required to have a reactance circuit which becomes a high impedance for the third harmonic frequency at the succeeding stage. In this embodiment, a parallel resonant circuit 32 with inductance L and capacitance C is used. The L and C of the parallel resonant circuit 32 have element constants selected to resonate at the third harmonic frequency. Therefore, when viewed from the output matching circuit 3!, the output transmission line is open at the third harmonic frequency. The second harmonic terminating circuit 95 is short-circuited and resonates at the second harmonic frequency and shows the open characteristics of high impedance at other frequencies.

Due to the above construction, the output load impedance characteristics at the drain terminal of the FET 85 is load-matched at the fundamental frequency, short-circuited at the second harmonic frequency and open at the third harmonic frequency. More particularly, the load conditions required for the operation of class-F amplifier are realized not only at the second harmonic but also at the third harmonic to achieve a higher efficiency than above two embodiments. As the reactance circuit, the parallel resonance circuit 32 may be replaced with the low pass filter shown in FIG. 4.

Figure 6:
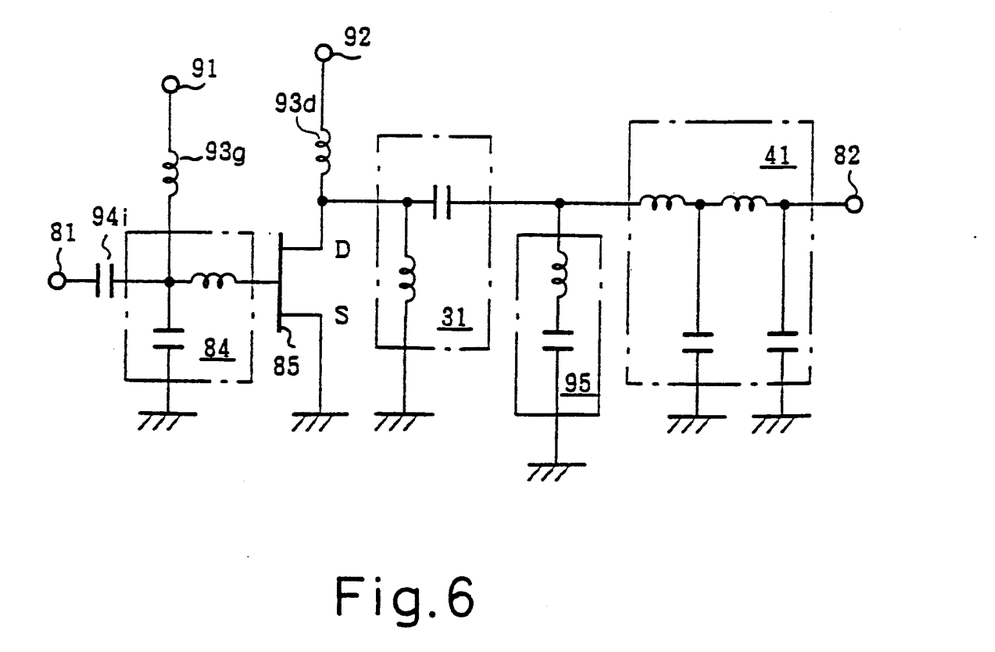
FIG. 6 is a circuit diagram to show the fifth embodiment of this invention.

FIG. 6 shows a circuit diagram of the fifth embodiment of this invention wherein the reactance circuit 31 which satisfies the matching conditions not only for the fundamental frequency and the second harmonic frequency but also for the third harmonic frequency and the output transmission line is formed by a low pass filter 41 of a two-stage construction comprising inductance L and capacitance C. The element constants of L and C are set so as to pass at the fundamental frequency with low loss and to break at the second and third harmonic frequencies with high impedance. As this has a high impedance for the second harmonic frequency, it has little influence on the resonance characteristics of the second harmonic terminating circuit 95. Therefore, the load conditions of the FET 85 for the second and third harmonics can be made closer to the ideal conditions of a class-F amplifier to thereby enhance the power efficiency.

Figure 7:
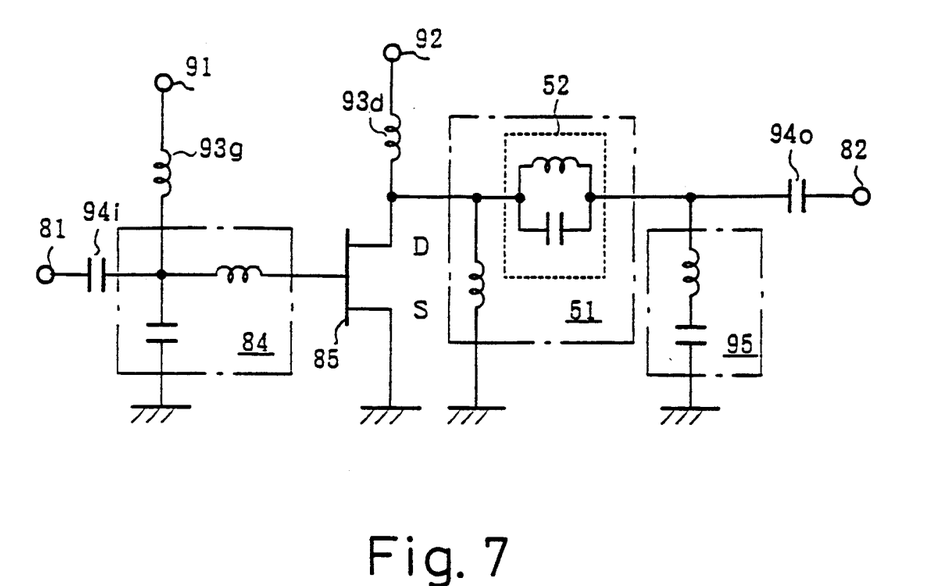
FIG. 7 is a circuit diagram to show the sixth embodiment of this invention.

FIG. 7 is a circuit diagram to show the sixth embodiment of this invention. In this embodiment, there is provided an output matching circuit 51 which assumes a high impedance, instead of matching, at the third harmonic frequency. In other words, the circuit 51 comprises inductance L and capacitance C which have an element constant each of which matches in conjugate between the output transmission line at the fundamental frequency and the second harmonic frequency, and have high input impedance characteristics at the third harmonic frequency. The characteristics to make high input impedance at the third harmonic frequency may be realized by the parallel resonant circuit 52 comprising L and C.

The second harmonic terminating circuit 95 is constructed to short-circuit and resonate at the second harmonic frequency and to have high impedance at other frequencies as described above. Therefore, the output load impedance characteristics of the drain terminal of the FET 85 are made to have matched loads at the fundamental frequency, be short-circuited at the second harmonic and open at the third harmonic to thereby satisfy the load conditions required for the operation of a class-F amplifier at the second and third harmonic frequencies and to achieve a higher power efficiency.

Figure 8:
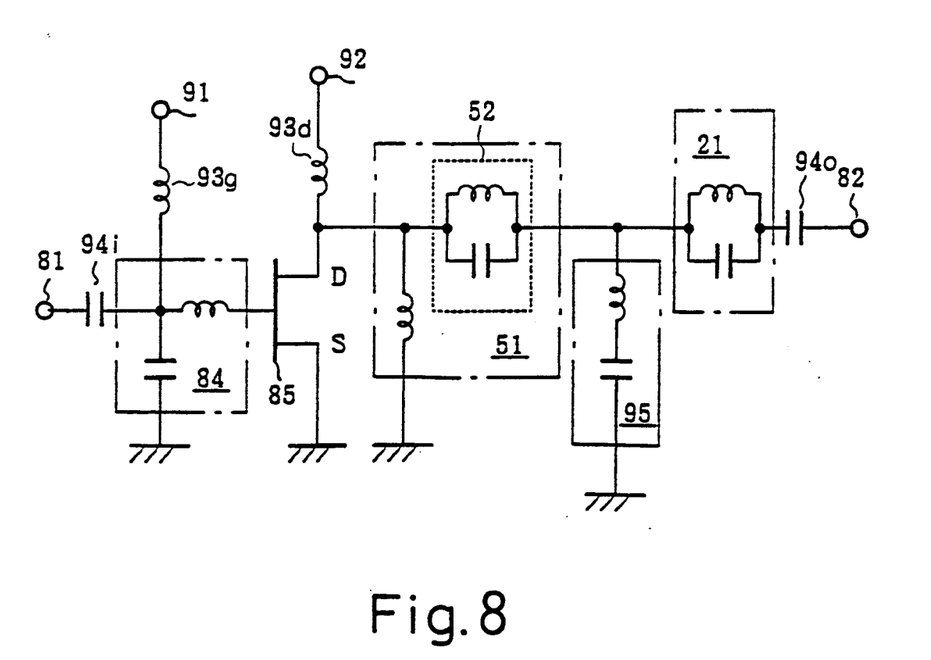
FIG. 8 is a circuit diagram to show the seventh embodiment of this invention.

FIG. 8 is a circuit diagram to show the seventh embodiment of this invention. This embodiment is obtained by adding a parallel resonant circuit 21 which becomes open at the second harmonic frequency to the structure of the sixth embodiment shown in FIG. 7. It can realize low impedance characteristics that are closer to the short-circuit conditions as the load impedance conditions at the second harmonic frequency. The parallel resonance circuit 21 may be replaced with the low pass filter shown in FIG. 4.

As the parallel resonance circuit 52 with L and C is connected in series to the output transmission line within the output matching circuit 51 in the sixth and seventh embodiments, a condenser 94 for blocking DC is connected at the stage preceding the transmission line.

Referring now to the second embodiment in FIG. 3 and the prior art class-F amplifier shown in FIG. 13, the results of test conducted to examine the influence on the fundamental wave matching conditions at the time of adjusting the short-circuit point at the drain terminal for the second harmonic will now be described.

Figure 9:
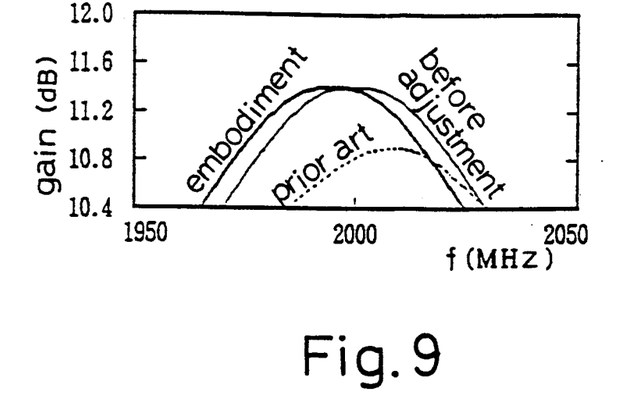
FIG. 9 is a graph to show the result of computer simulation of gain characteristics.

FIG. 9 shows the result of a computer simulation of gain characteristics on a modeled one-stage amplifier using a standard packaged GaAs FET. In the graph the horizontal axis shows the frequency (in the unit of MHz) and the vertical axis shows the gain (in the unit of dB).

In comparison with the gain characteristics of this invention embodiment amplifiers before adjustment of the harmonic terminating circuit and of a prior art amplifier, whereas the prior art amplifier decreased in gain by about 0.5 dB after adjustment to satisfy short terminating conditions for the second harmonic as shown with the broken line, this invention embodiments did not show a decrease in gain as shown with the bold line (2 GHz). The 0.5 dB decrease in gain leads to about an 8% decrease in efficiency if the amplifier of the gain 10 dB has 70% power added efficiency $\eta$add ($P_O - P_i/P_{DC} \times 100$), wherein the input power is denoted with $P_i$, output power with $P_i$, and the DC consumption power of the transistor with $P_{DC}$. Decrease in gain is more marked as the frequency increases.

Figure 10A:
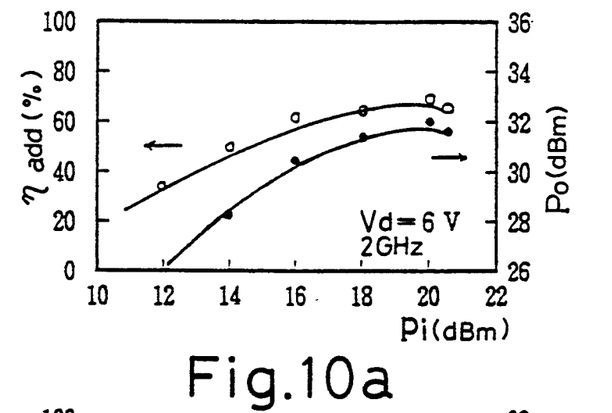
FIGS. 10a and 10b are graphs to show the characteristics relative to the output power $P_0$ against the input power $P_i$ of an amplifier of the embodiments of this invention.
Figure 10B:
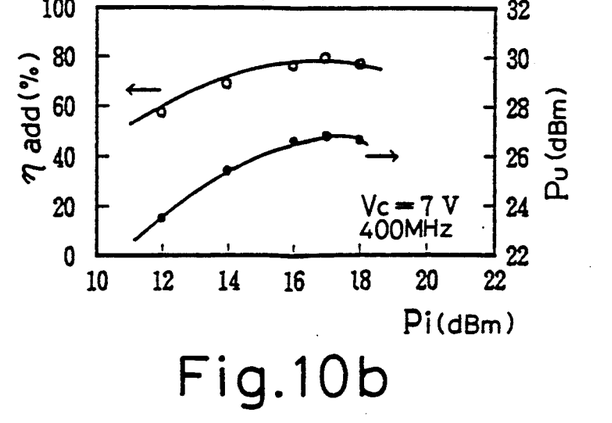

FIGS. 10a and 10b show characteristics of the input power $P_i$ and the output power $P_o$ of the amplifier of this embodiment. FIG. 10a shows the characteristics of the embodiment with a 2 GHz amplifier while FIG. 10b shows that of the embodiment with a 400 MHz amplifier. A sufficiently high gain can be obtained with a Si bipolar transistor at 400 MHz as long as the transistor is used as an active device.

As shown in FIG. 10a, a power added efficiency as high as 68% could be obtained if, for instance, the input power $P_i$ is 20 dBm.

As shown in FIG. 10b, if the input power $P_i$ is 17 dBm, a power added efficiency as high as 80% is obtained, compared to 30–40% obtained by prior art class-C amplifiers. This invention therefore achieves high efficiency as compared with the prior.

Although the output matching circuit is realized with one stage construction in the above embodiments, a multi-stage construction may be utilized to realize the predetermined matching conditions for higher efficiency.

What is claimed is:

1. A high frequency amplifier for amplifying an input high frequency signal which has a fundamental frequency, comprising:
    an active device which amplifies in power the fundamental frequency of the input high frequency signal; and
    an output circuit which is coupled between an output terminal of the active device and an output transmission line, the output circuit including an output matching circuit which matches an output from said active device with said output transmission line for the fundamental frequency and also for a second harmonic frequency thereof, and an even harmonic terminating circuit, connected to an output side of the output matching circuit, which has a high input impedance at the fundamental frequency and a low input impedance at least at the second harmonic frequency thereof.

2. The high frequency amplifier as claimed in claim 1 further comprising a reactance circuit provided between the even harmonic terminating circuit and the output transmission line to have high a input impedance for the second harmonic frequency.

3. The high frequency amplifier as claimed in claim 2 wherein the output matching circuit is adapted to have a high input impedance for the third harmonic frequency.

4. The high frequency amplifier as claimed in claim 2 wherein the output matching circuit includes means for impedance matching not only the fundamental frequency and the second harmonic frequency but also the third harmonic frequency, the even harmonic terminating circuit has a high input impedance for the third harmonic frequency, and further comprising a reactance circuit inserted between the even harmonic terminating circuit and the output transmission line which has high input impedance for said third harmonic frequency.

5. The high frequency amplifier as claimed in claim 1 wherein the output matching circuit is adapted to have a high input impedance for the third harmonic frequency.

6. The high frequency amplifier as claimed in claim 1 wherein the output matching circuit includes means for impedance matching not only the fundamental frequency and the second harmonic frequency but also the third harmonic frequency, the even harmonic terminating circuit has a high input impedance for the third harmonic frequency, and further comprising a reactance circuit inserted between the even harmonic terminating circuit and the output transmission line which has a high input impedance for said third harmonic frequency.

7. The high frequency amplifier as in claim 1 wherein said active device is a transistor.

8. An impedance matched high frequency amplifier, comprising:
    means for receiving an input high frequency signal which has a fundamental frequency and at least one harmonic frequency of the fundamental frequency;
    an amplifying structure, receiving said input high frequency signal and producing an amplified output thereof;
    a first output matching circuit, having matching components which match an output impedance of said amplifier with an impedance of an output transmission line for at least the fundamental frequency and a second harmonic frequency, said output matching circuit receiving the amplified output of said amplifier as an input, and producing a first matched output; and
    a harmonic terminating circuit, connected to said first matched output, which has a high impedance to ground at the fundamental frequency, and a low impedance to ground at the second harmonic frequency, said harmonic terminating circuit operating independent of stray reactance in the amplifier due to said matching by said first output matching circuit, since the output impedance of the amplifier is offset by the first output matching circuit, so that the real reactance to be connected to the amplifier becomes the harmonic terminating circuit.

9. An amplifier circuit as in claim 8 wherein said amplifier is a transistor.

10. An amplifier circuit as in claim 9 further comprising an input matching circuit for impedance matching the input impedance of the transistor to the input signal.

11. An amplifier circuit as in claim 8 further comprising a parallel resonant circuit coupled between said harmonic terminating circuit and said output transmission line, which resonates at the second harmonic frequency to increase impedance viewed from said harmonic terminating circuit towards the output line.

12. An amplifier device as in claim 11 wherein said output matching circuit matches the output of said amplifier to said transmission line also for the third harmonic frequency, in addition to the fundamental and second harmonic frequency.

13. An amplifier device as in claim 11 wherein said output matching circuit includes a third harmonic high impedance circuit which provides a high impedance to the third harmonic frequency.

14. An amplifier device as in claim 13 wherein said output matching circuit comprises a coil having one end connected to an output of said amplifier and another end connected to ground, and said third harmonic high impedance circuit connected between said one end of said coil and said harmonic terminating circuit, said third harmonic high impedance circuit comprising a parallel combination of a coil and a capacitor.

15. An amplified device as in claim 8 further comprising a low pass filter coupled between said harmonic terminating circuit and said output transmission line, said low pass filter passing frequencies close to the fundamental frequency with low loss, but providing a high impedance against said second harmonic frequency.

16. An amplifier device as in claim 15 wherein said output matching circuit matches the output of said amplifier to said transmission line also for the third harmonic frequency in addition to the fundamental and second harmonic frequency.

17. An amplifier device as in claim 16 wherein said low pass filter also has a high impedance at said third harmonic frequency.

18. An amplifier device as in claim 8 wherein said output matching circuit matches the output of said amplifier to said transmission line also for the third harmonic frequency in addition to matching for the fundamental and second harmonic frequencies.

19. An amplifier device as in claim 8 wherein said output matching circuit includes a third harmonic high impedance circuit which provides a high impedance to the third harmonic frequency.

20. An amplifier device as in claim 19 wherein said output matching circuit comprises a coil having one end connected to an output of said amplifier and another end connected to ground, and said third harmonic high impedance circuit connected between said one end of said coil and said harmonic terminating circuit, said third harmonic high impedance circuit comprising a parallel combination of a coil and a capacitor.

* * * * *